(12) United States Patent
Mohamadi

(10) Patent No.: US 7,791,556 B2
(45) Date of Patent: *Sep. 7, 2010

(54) TRANSMISSION LINE DISTRIBUTED OSCILLATOR

(76) Inventor: Farrokh Mohamadi, 8 Halley, Irvine, CA (US) 92612-3797

( * ) Notice: Subject to any disclaimer, the term of this patent is extended or adjusted under 35 U.S.C. 154(b) by 734 days.

This patent is subject to a terminal disclaimer.

(21) Appl. No.: 11/536,625

(22) Filed: Sep. 28, 2006

(65) Prior Publication Data
US 2007/0018903 A1 Jan. 25, 2007

Related U.S. Application Data

(63) Continuation-in-part of application No. 11/182,344, filed on Jul. 15, 2005, now Pat. No. 7,321,339, which is a continuation-in-part of application No. 11/141,283, filed on May 31, 2005, now Pat. No. 7,312,763.

(60) Provisional application No. 60/721,204, filed on Sep. 28, 2005.

(51) Int. Cl.
*H01Q 21/00* (2006.01)
(52) U.S. Cl. ........................ 343/853; 343/795
(58) Field of Classification Search .......... 343/700 MS, 343/795, 850, 853
See application file for complete search history.

(56) References Cited

U.S. PATENT DOCUMENTS

| 6,377,217 | B1 * | 4/2002 | Zhu et al. | ............. | 343/700 MS |
| 6,828,556 | B2 * | 12/2004 | Pobanz et al. | ............ | 250/336.1 |
| 6,870,503 | B2 | 3/2005 | Mohamadi | | |
| 6,885,344 | B2 | 4/2005 | Mohamadi | | |
| 6,963,307 | B2 | 11/2005 | Mohamadi | | |
| 7,312,763 | B2 * | 12/2007 | Mohamadi | .................. | 343/853 |
| 7,321,339 | B2 * | 1/2008 | Mohamadi | .................. | 343/853 |
| 2008/0252546 | A1 * | 10/2008 | Mohamadi | .................. | 343/853 |

OTHER PUBLICATIONS

S. Bassagni, I. Chalamatac, V. Syrotuk, and B. Woodward, "A Distance Routing Effect Algorithm for Mobility (DREAM)," Proc. Mobicom, Oct. 1998, pp. 76-84, Dallas, TX.

J Liu, et al., A Dual-Space Approach to Tracking and Sensor Management in Wireless Sensor Networks, Proc. Of the 1th ACM Intl. Workshop on Wireless Sensors Networks, Sep. 2002.

R. Pasand, et al., The Capacity of Asynchronous Mary Time Hopping PPM UWB Mutiple Access Communication Systems, IEEE, 2004, pp. 4745-4749.

N. August, R. Thirugnanam, and D. Ha, An Adaptive UWB Modulation Scheme for Optimization of Energy, BER, and Data Rate, TM3-2, IEEE, 2004, pp. 182-186.

(Continued)

*Primary Examiner*—Tan Ho
(74) *Attorney, Agent, or Firm*—Haynes & Boone, LLP.

(57) ABSTRACT

In one embodiment, an integrated circuit antenna array includes: a substrate, a plurality of antennas adjacent the substrate; and an RF network adjacent the substrate, the RF feed network coupling to a distributed plurality of amplifiers integrated with the substrate, wherein the RF feed network and the distributed plurality of amplifiers are configured to form a resonant network such that if a timing signal is injected into an input port of the RF network, the resonant network oscillates to provide a globally synchronized RF signal to each of the antennas.

9 Claims, 15 Drawing Sheets

OTHER PUBLICATIONS

H. Zirath et al., Development of 60-GHz Front-end Circuit for a High-Data-Rate Communication System, IEEE Journal of Solid-State Circuits, Oct. 2004, vol. 39 No. 10.

F. Mohamadi, A Proposed Completely Electronically Controlled Beamforming Technology for Coverage Enhancement, IEEE P802.15 Working Group, Mar. 2005, Atlanta, GA.

C. Goldsmith, T.H. Lin, B. Powers, W.R. Wu, and B. Norvell, Micromechanical Membrane Switches for Microwave Applications, 1995 IEEE MTT-S Dig., 91-94.

A. Malczewski, X-band RF MEMS Phase Shifters for Phased Array Applications, IEEE Microwave and Guided Wave Letters, Dec. 1999, pp. 517-519, vol. 9.

J. Hayden and G. Rebeiz, Very Low-Loss Distributed X-Band and Ka-band MEMS Phase Shifters Using Meta-Air-Metal Capacitors, IEEE, Jan. 2003, vol. 51, No. 1.

F. Mohamadi, Wafer Scale Integration of Active Antenna Array, RF Design, Feb. 2005, pp. 48-64.

F. Mohamadi, Si Integration with Millimeter Wave Phased Array Antenna, RF Design, Feb. 2004, pp. 40-48.

F. Mohamadi, Critical Data Timing in Distributed Systems, Defense Electronics, May 2004, pp. 13-18.

B. Kleveland, et al., Exploiting CMOS Reverse Interconnect Scaling in Multigigahertz Amplifier and Oscillator Design, IEEE Journal of Solid-State Circuits, Oct. 2001.

T. Shibata and E. Sano, Characterization of MIS Structure Coplanar Transmission Lines for Investigation of Signal Propagation in Integrated Circuits, IEEE, 1990, vol. 38 No. 7.

A. Zolfaghari and B. Razavi, A Low-Power 2.4 GHz Transmitter/Receiver CMOS IC, IEEE Journal of Solid-State Circuits, Feb. 2003, pp. 176-183, vol. 38 No. 2.

* cited by examiner

TRANSMISSION LINE DISTRIBUTED OSCILLATOR

RELATED APPLICATIONS

This application is a continuation-in-part of U.S. application Ser. No. 11/182,344, filed Jul. 15, 2005, now U.S. Pat. No. 7,321,339 which in turn is a continuation-in-part of U.S. application Ser. No. 11/141,283, filed May 31, 2005 now U.S. Pat. No. 7,312,763. In addition, this application claims the benefit of U.S. Provisional Application No. 60/721,204, filed Sep. 28, 2005.

TECHNICAL FIELD

The present invention relates generally to oscillators and more particularly to a transmission line distributed oscillator.

BACKGROUND

Conventional beam forming systems are often cumbersome to manufacture. In particular, conventional beam forming antenna arrays require complicated feed structures and phase-shifters that are impractical to be implemented in a semiconductor-based design due to its cost, power consumption and deficiency in electrical characteristics such as insertion loss and quantization noise levels. In addition, such beam forming arrays make digital signal processing techniques cumbersome as the operating frequency is increased. In addition, at the higher data rates enabled by high frequency operation, multipath fading and cross-interference becomes a serious issue. Adaptive beam forming techniques are known to combat these problems. But adaptive beam forming for transmission at 10 GHz or higher frequencies requires massively parallel utilization of A/D and D/A converters.

To provide a beamforming system compatible with semiconductor processes, the applicant has provided a number of integrated antenna circuits. For example, U.S. application Ser. No. 11/141,283 discloses a beamforming system in which an RF signal is distributed through a transmission network to integrated antenna circuits that include a beamforming circuit that adjusts the phase and/or the amplitude of distributed RF signal responsive to control from a controller/phase manager circuit. In a receive configuration, each beamforming circuit adjusts the phase and/or the amplitude of a received RF signal from the corresponding integrated circuit's antenna and provide the resulting adjusted received RF signal to the transmission network. Although such integrated antenna circuits consume a relatively small amount of power, transmission loss is incurred through the resulting RF propagation in the transmission network. To account for such loss, U.S. application Ser. No. 11/141,283 discloses a distributed amplification system such that RF signals propagated through the transmission network are actually amplified rather than attenuated. However, the transmission network introduces dispersion as well.

To avoid the dispersion introduced by an RF transmission network, an alternative integrated circuit (which may also be denoted as an integrated oscillator circuit) has been developed such as disclosed in U.S. Pat. No. 6,982,670. For example, each integrated oscillator/antenna circuit may include an oscillator such as a phase-locked loop (PLL) and a corresponding antenna and mixer. In such an embodiment, each PLL is operable to receive a reference signal and provide a frequency-shifted signal output signal that is synchronous with the reference signal. Should an integrated oscillator/antenna circuit be configured for transmission, its output signal is upconverted in the unit's mixer and the upconverted signal transmitted by the corresponding antenna. Alternatively, should an integrated oscillator/antenna circuit be configured for reception, a received RF signal from the unit's antenna is downconverted in the mixer responsive to the frequency-shifted output signal from the PLL. Although the integrated oscillator circuit approach does not have the dispersion issues resulting from propagation through a transmission network, the inclusion of an oscillator in each integrated oscillator circuit demands significantly more power than the transmission network approach.

Accordingly, there is a need in the art for beamforming systems compatible with semiconductor manufacturing processes having reduced power demands and reduced signal dispersion.

SUMMARY

In accordance with an aspect of the invention, an integrated circuit antenna array includes: a substrate, a plurality of antennas adjacent the substrate; and an RF network adjacent the substrate, the RE feed network coupling to a distributed plurality of amplifiers integrated with the substrate, wherein the RF feed network and the distributed plurality of amplifiers are configured to form a resonant network such that if a timing signal is injected into an input port of the RF network, the resonant network oscillates to provide a globally synchronized RF signal to each of the antennas.

In accordance with another aspect of the invention, an antenna array is provided that includes: a semiconductor substrate having a first surface and an opposing second surface; a plurality of heavily-doped contact regions extending from the first surface to the second surface; a plurality of antennas formed on an insulating layer adjacent the first surface, each antenna being coupled to corresponding ones of the contact regions by vias; and a conductor-based RF feed network adjacent the second surface for coupling an input port to the plurality of antennas, the RF feed network coupling to a distributed plurality of amplifiers integrated into the second surface of the substrate, wherein the RF feed network and the distributed plurality of amplifiers are configure to form a resonant network such that if a timing signal is injected into the input port of the RF feed network, a globally synchronized RF signal is received at each of the antennas.

The invention will be more fully understood upon consideration of the following detailed description, taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

The present invention provides a wafer scale antenna module in which a resonant transmission network with distributed amplification is driven by a triggering pulse waveform such that the entire transmission network oscillates acting as a distributed oscillator. Advantageously, the RF signal from the resulting distributed oscillator thereby arrives synchronously at a plurality of integrated antenna circuits coupled to the distributed oscillator. Each integrated antenna circuit may include a modulator such as the pulse shaping circuit disclosed in U.S. application Ser. No. 11/454,915. In this fashion, ultra wideband pulses may be propagated from the resulting wafer scale antenna module without incurring dispersion caused by propagation of the pulses through a transmission network. Significantly, however, such ultra wideband pulses may be generated without the need for oscillators such as a voltage controlled oscillator (VCO) in each integrated antenna circuit. Thus, the disclosed distributed oscillator provides substantial power savings as opposed to integrated oscillator circuit embodiments.

Figure 1:
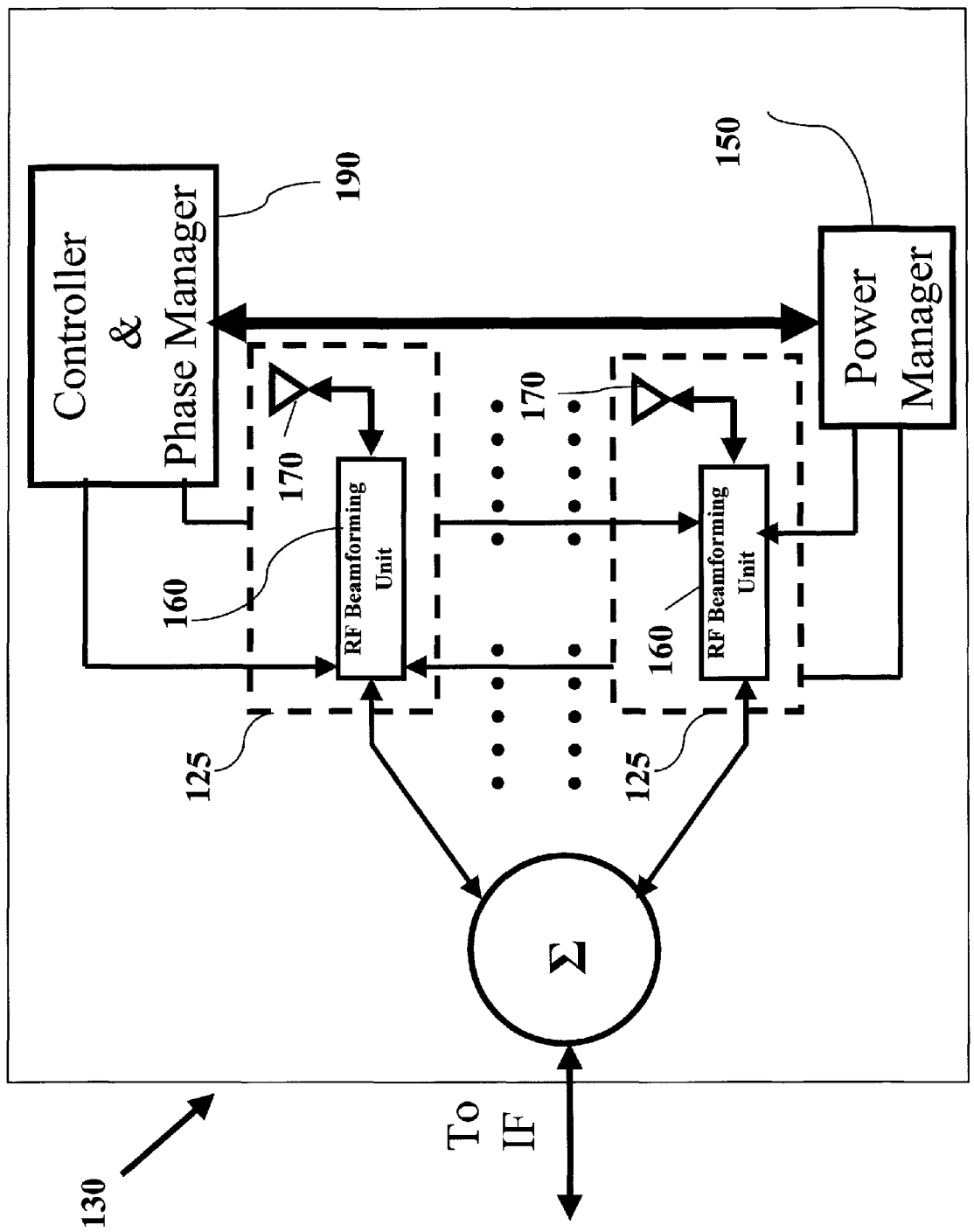
FIG. 1 is a block diagram of a beamforming antenna array in which the beamforming is performed in the RF domain.

Embodiments of the wafer scale beamforming approach disclosed herein may be better understood with reference to the beamforming system of FIG. 1, which illustrates an integrated RF beamforming and controller unit 130. In this embodiment, the receive and transmit antenna arrays are the same such that each antenna 170 functions to both transmit and receive. A plurality of integrated antenna circuits 125 each includes an RF beamforming interface circuit 160 and receive/transmit antenna 170. RF beamforming interface circuit 160 adjusts the phase and/or the amplitude of the received and transmitted RF signal responsive to control from a controller/phase manager circuit 190. Although illustrated having a one-to-one relationship between beamforming interface circuits 160 and antennas 170, it will be appreciated, however, that an integrated antenna circuit 125 may include a plurality of antennas all driven by RF beamforming interface circuit 160.

Figure 2:
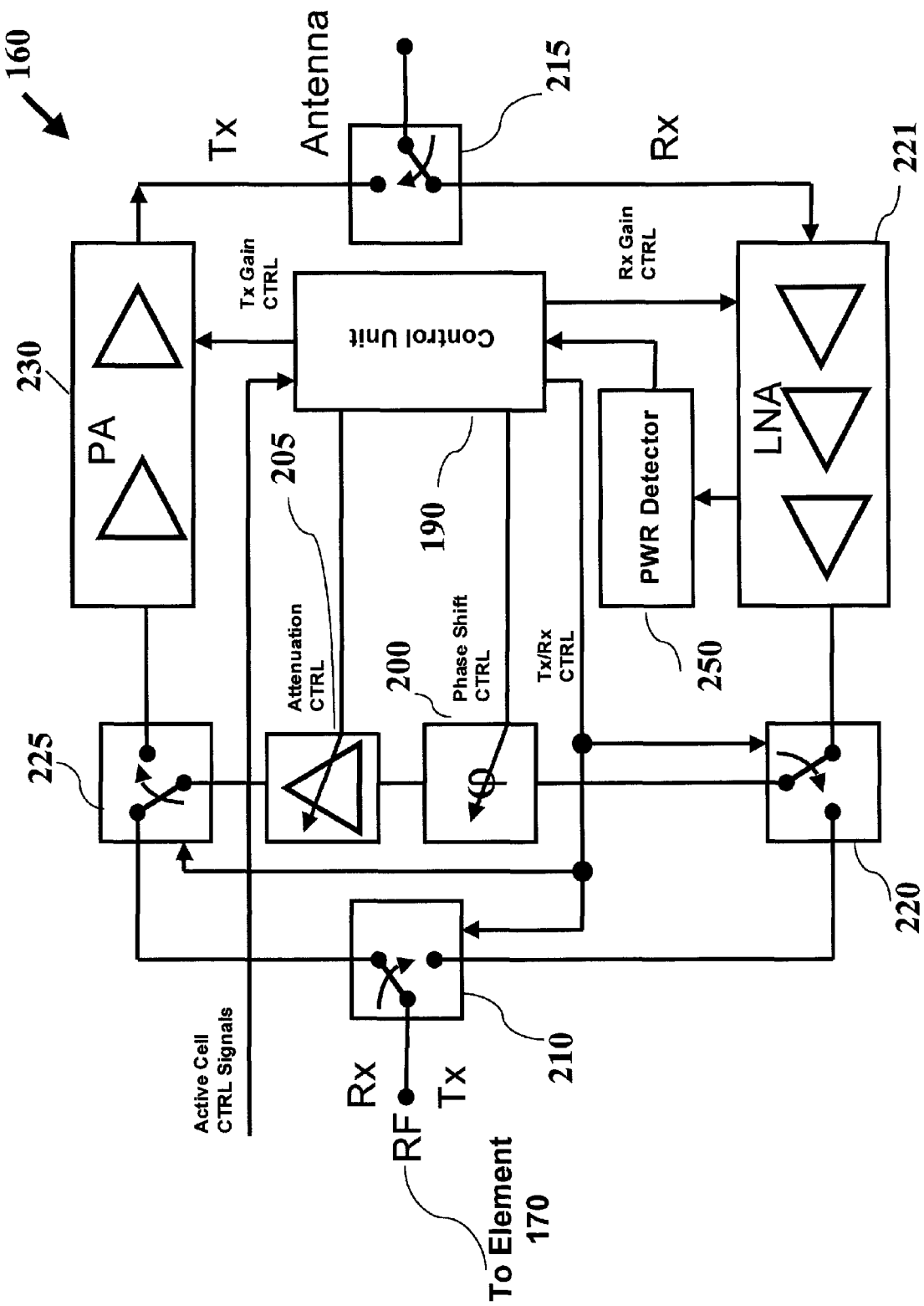
FIG. 2 is a schematic illustration of an RF beamforming interface circuit for the array of FIG. 1.

A circuit diagram for an exemplary embodiment of RF beamforming interface circuit 160 is shown in FIG. 2. Note that the beamforming performed by beamforming circuits 160 may be performed using either phase shifting, amplitude variation, or a combination of both phase shifting and amplitude variation. Accordingly, RF beamforming interface circuit 160 is shown including both a variable phase shifter 200 and a variable attenuator 205. It will be appreciated, however, that the inclusion of either phase shifter 200 or attenuator 205 will depend upon the type of beamforming being performed. To provide a compact design, RF beamforming circuit may include RF switches/multiplexers 210, 215, 220, and 225 so that phase shifter 200 and attenuator 205 may be used in either a receive configuration or a transmit configuration. For example, in a receive configuration RF switch 215 routes the received RF signal to a low noise amplifier 221. The resulting amplified signal is then routed by switch 220 to phase shifter 200 and/or attenuator 205. The phase shifting and/or attenuation provided by phase shifter 200 and attenuator 205 are under the control of controller/phase manager circuit 190. The phase shifted signal routes through RF switch 225 to RF switch 210. RF switch 210 then routes the signal to IF processing circuitry (not illustrated).

In a transmit configuration, the RF signal received from IF processing circuitry (alternatively, a direct down-conversion architecture may be used to provide the RF signal) routes through RF switch 210 to RF switch 220, which in turn routes the RF signal to phase shifter 200 and/or attenuator 205. The resulting shifted signal is then routed through RF switch 225 to a power amplifier 230. The amplified RF signal then routes through RF switch 215 to antenna 170 (FIG. 1). It will be appreciated, however, that different configurations of switches may be implemented to provide this use of a single set of phase-shifter 200 and/or attenuator 205 in both the receive and transmit configuration. In addition, alternate embodiments of RF beamforming interface circuit 160 may be constructed not including switches 210, 220, and 225 such that the receive and transmit paths do not share phase shifter 200 and/or attenuator 205. In such embodiments, RF beamforming interface circuit 160 would include separate phase-shifters and/or attenuators for the receive path and transmit path.

To assist the beamforming capability, a power detector 250 functions as a received signal strength indicator to measure the power in the received RF signal. For example, power detector 250 may comprise a calibrated envelope detector. As seen in FIG. 1, a power manager 150 may detect the peak power determined by the various power detectors 250 within each integrated antenna circuit 125. The integrated antenna circuit 125 having the peak detected power may be denoted as the "master" integrated antenna circuit. Power manager 150 may then determine the relative delays for the envelopes for the RF signals from the remaining integrated antenna circuits 125 with respect to the envelope for the master integrated antenna circuit 125. To transmit in the same direction as this received RF signal, controller/phase manager 190 may determine the phases corresponding to these detected delays and command the transmitted phase shifts/attenuations accordingly. Alternatively, a desired receive or transmit beamforming direction may simply be commanded by controller/phase manager 190 rather than derived from a received signal. In such embodiment, power managers 150 and 250 need not be included since phasing information will not be derived from a received RF signal.

Regardless of whether integrated antenna circuits 125 perform their beamforming using phase shifting and/or amplitude variation, the shifting and/or variation is performed on the RF signal received either from the IF stage (in a transmit mode) or from its antenna 170 (in a receive mode). By performing the beamforming directly in the RF domain as discussed with respect to FIGS. 1 and 2, substantial savings are introduced over a system that performs its beamforming in the IF or baseband domain. Such IF or baseband systems must include A/D converters for each RF channel being processed. In contrast, the system shown in FIG. 1 may supply a combined RF signal from an adder 140. From an IF standpoint, it is just processing a single RF channel for the system of FIG. 1, thereby requiring just a single A/D. Accordingly, the following discussion will assume that the beamforming is performed in the RF domain. The injection of phase and/or attenuation control signals by controller/phase manager circuit 190 into each integrated antenna circuit 125 may be performed inductively as discussed in commonly-assigned U.S. Pat. No. 6,885,344, the contents of which are incorporated by reference.

A transmission network couples the RF signal from the IF stage (or alternatively, from a baseband stage in a direct downconversion embodiment) to the RF beamforming interface circuits. As set forth in U.S. application Ser. No. 11/141, 283, a particularly advantageous transmission network with regard to a wafer scale approach is a coplanar waveguide (CPW) network. Although the scope of the invention includes the use of any suitable architecture for a transmission network such as CPW, microstrip, and planar waveguide, CPW enjoys superior shielding properties over microstrip. Thus, the following discussion will assume without loss of generality that the transmission network is implemented using CPW. This network may be arranged in an "H" array such that the electrical length from an RF input port to any given integrated antenna circuit is the same as that to all the remaining integrated antenna circuits. Although CPW has superior shielding properties, the RF propagation across a CPW network on a semiconductor wafer such as an 8" wafer may introduce losses as high as 120 dB. To counteract such losses, a plurality of distributed amplifiers may be coupled to the CPW network as disclosed in U.S. application Ser. No. 11/141,283. For example, a first linear transistor amplifier (which may be denoted as a driving amplifier) amplifies a received RF signal into a length of the CPW network into a second linear transistor amplifier (which may be denoted as a matching amplifier) configured to match its output impedance to the characteristic impedance of the CPW network. Both the gain of the driving amplifier and the gain and the output impedance of the matching amplifier are tuned using reactive loads such as integrated inductors. In this fashion, resistive losses are minimized. These gains are maintained so that linear operation is achieved. In this fashion, an RF signal driven into an input port of the CPW network is linearly amplified and propagated to the integrated antenna circuits, despite the transmission line losses.

In the present invention, it has been observed that the combination of the resulting active devices and the transmission network can be tuned to form a resonant network. Because the network is resonant, a globally-synchronized oscillation can be induced by triggering the network with an appropriate timing signal. The distributed amplifiers thus injection lock to each other such that the resonant network forms a distributed oscillator providing each integrated antenna circuit with a globally synchronized RF signal. This RF signal may then be modulated if desired such as through the pulse shaping circuit of U.S. application Ser. No. 11/454, 915 (the contents of which are incorporated by reference) or through an alternative pattern generation. In addition, the RF signal received at the integrated antenna circuits may be phase shifted using a phase shifter such as the analog phase shifter in U.S. application Ser. No. 11/535,928 (the contents of which are incorporated by reference) or any other suitable phase shifter such as disclosed in U.S. application Ser. No. 11/182,344.

Figure 3A:
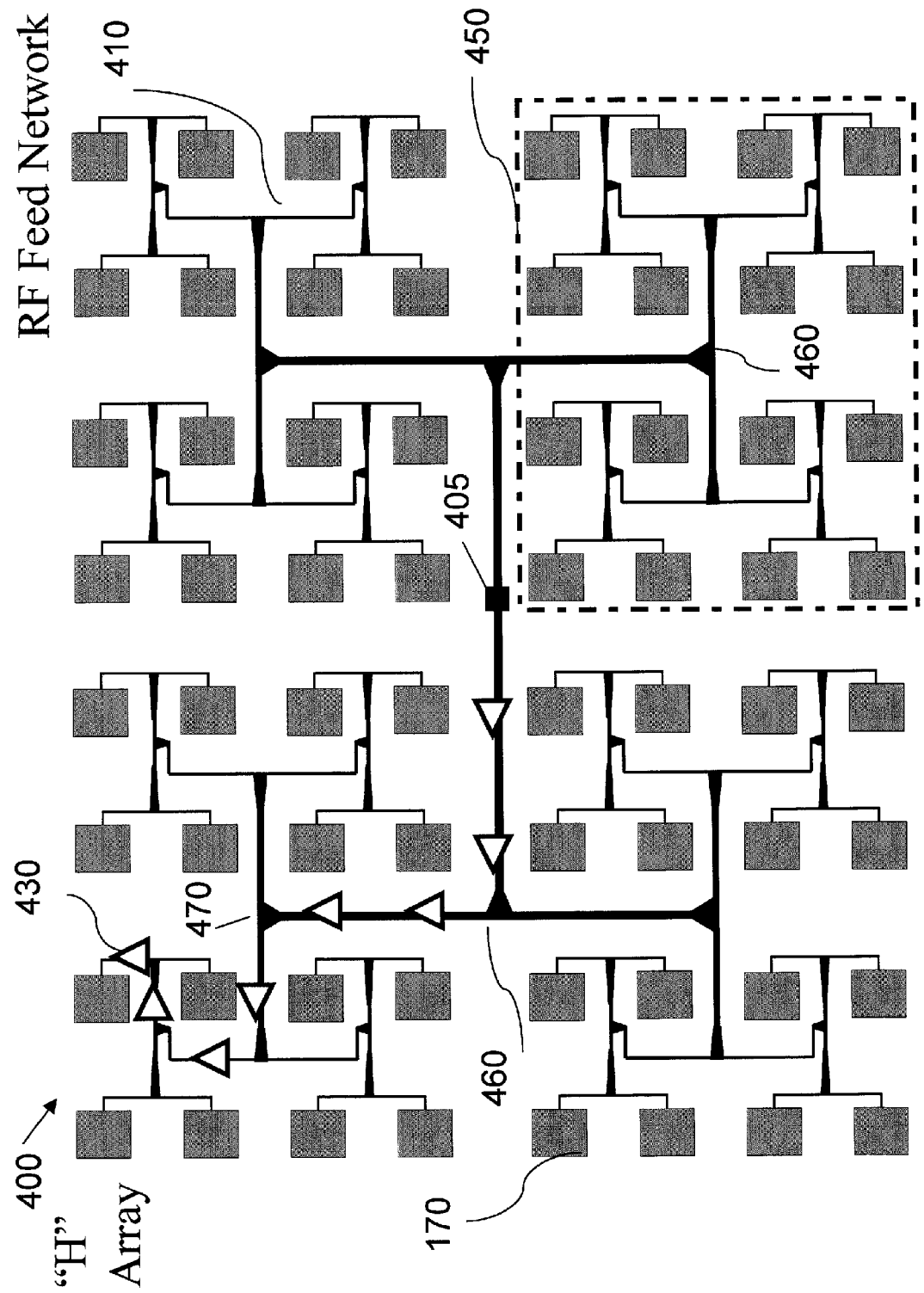
FIG. 3a is an illustration of a wafer scale resonant transmitting network in accordance with an embodiment of the invention.
Figure 3B:
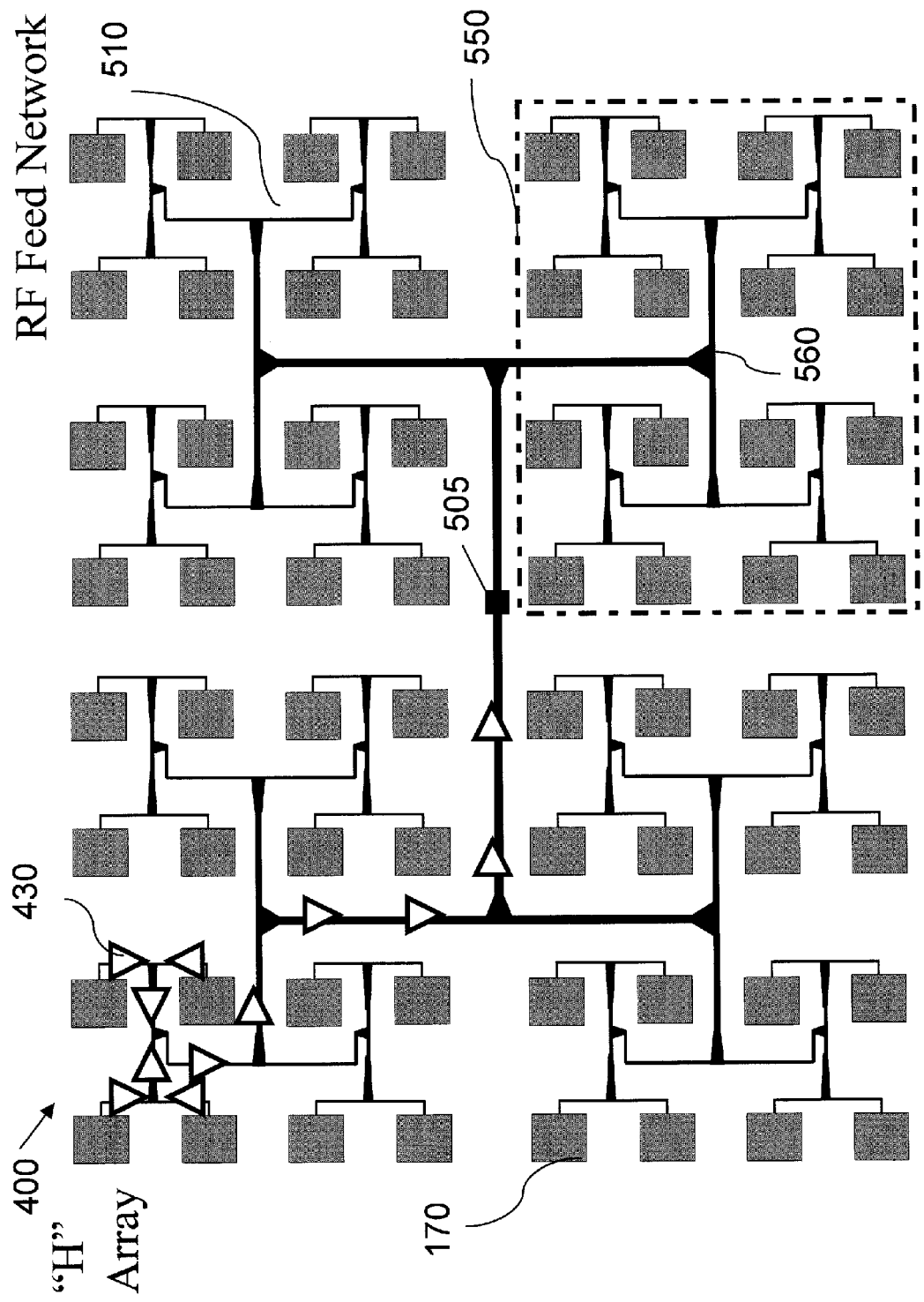
FIG. 3b is an illustration of a wafer scale receiving network having linear amplification in accordance with an embodiment of the invention.
Figure 4:
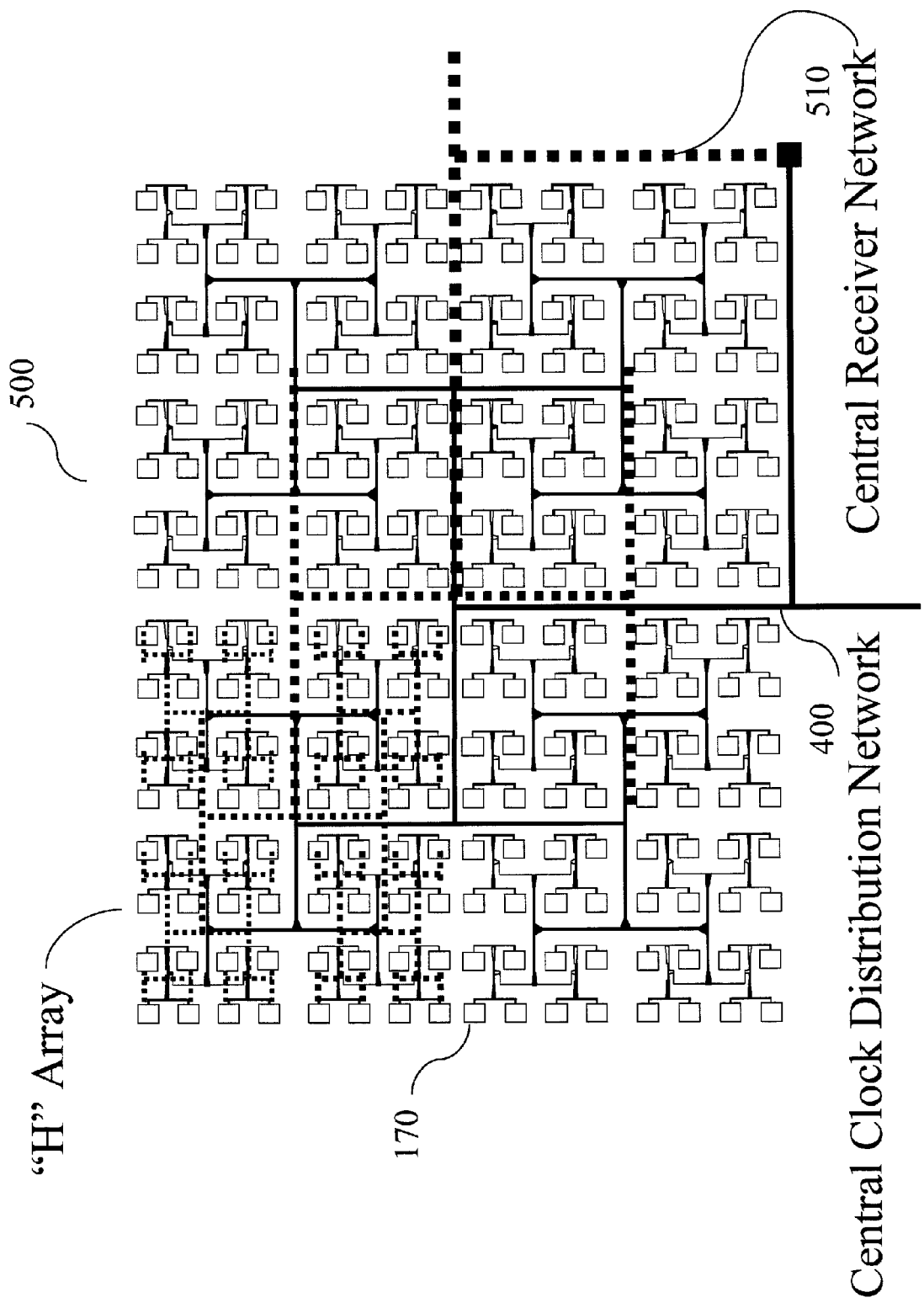
FIG. 4 illustrates a wafer scale antenna module including the transmitting network of FIG. 3a and the receiving network of FIG. 3b.
Figure 5:
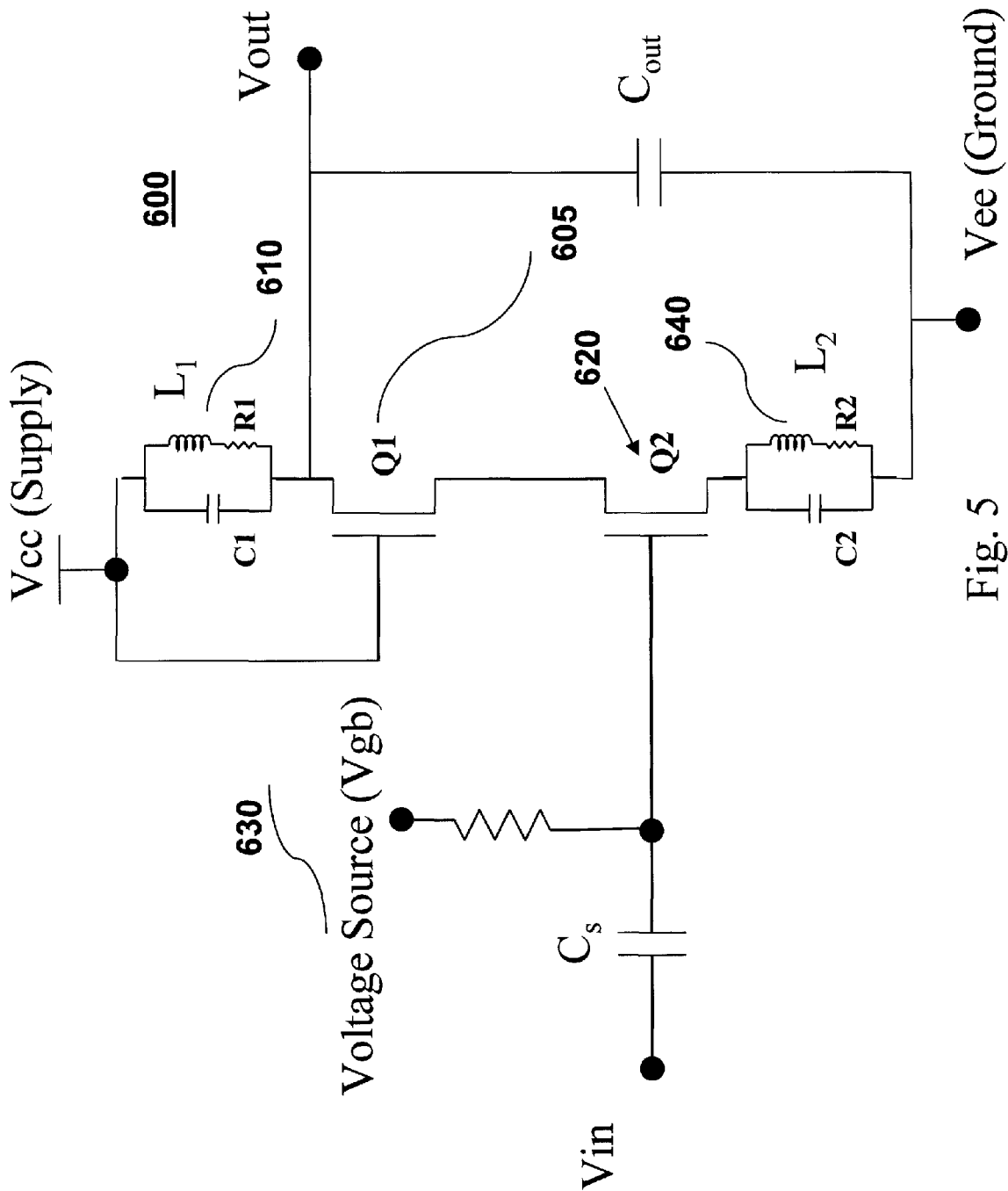
FIG. 5 is a schematic illustration of a matching amplifier in accordance with an embodiment of the invention.

Turning now to FIG. 3a, a resonant half-duplex transmission network 410 is implemented in an 8" wafer scale antenna module 400 having 64 antenna elements 170. The triggering signal to trigger the resonant oscillation is injected into a center feed point 405. Distributed amplifiers 430 coupled to the network then injection lock to each other such that each antenna 170 may receive a globally synchronized RF signal. In contrast to the transmission network, a half-duplex receiving CPW network 510 as seen in FIG. 3b for wafer scale antenna module 400 operates in the linear amplification regime as described earlier. A wafer scale antenna module 500 including 256 antenna elements 170 is shown in FIG. 4 that includes both a resonant transmitting network 400 and a linear amplification receiving network 510 is illustrated in FIG. 5. Because of the global synchronization provided by the resonant operation of network 400, it may also be denoted as a central clock distribution network.

Each transmission network may be single-ended or differential. In one embodiment, the network may comprise a coplanar waveguide (CPW) having a conductor width of a few microns (e.g., 4 microns). With such a small width or pitch to the network, a first array of 64 antenna elements and a second array of 1024 antenna elements may be readily networked in an 8 inch wafer substrate for 10 GHz and 40 GHz operation, respectively. Alternatively, a wafer scale antenna module may be dedicated to a single frequency band of operation.

The design of the distributed amplifiers is not critical so long as they provide sufficient amplification and achieve a resonant operation with the transmission network. Thus, it will be appreciated that the distributed amplifiers may comprise the driving/matching amplifiers described earlier or alternative distributed amplifiers may be used. In one embodiment, a driving amplifier in the receiving and transmission networks is followed by a matching amplifier for efficient performance. An exemplary embodiment of a FET-based matching amplifier 600 is illustrated in FIG. 5. Matching amplifier 600 couples to a coplanar waveguide network (not illustrated) at input port Vin and output port Vout. An analogous BJT-based architecture may also be implemented. The FETs may be either NMOS or PMOS. A first NMOS FET Q1 605 has its drain coupled through an integrated inductor (L1) 610 to a supply voltage Vcc. This integrated inductor L1 may be formed using metal layers in a semiconductor process as discussed in commonly-assigned U.S. Pat. No. 6,963,307.

Because such an integrated inductor L1 will also have a stray capacitance and resistance, these stray effects are modeled by capacitor C1 and resistor R1. The metal layers in the semiconductor process may also be used to form a DC blocking capacitor $C_S$ and an output capacitor $C_{out}$. The supply voltage also biases the gate of Q1. Q1 has its drain driving Vout and its drain coupled to a second NMOS FET Q2 620. A voltage source 630 coupled through a high value resistor or configured transistor biases the gate of Q2 620 with a voltage Vgb (whereas in a BJT embodiment, the base of Q1 is biased by a current source). The source of Q2 620 couples to ground through an integrated inductor (L2) 640. Analogous to inductor 610, inductor 640 has its stray capacitance and resistance modeled by capacitor C2 and resistor R2. It may be shown that an input resistance Rin for amplifier 600 is as follows:

$$Rin=(gm)*L2/Cgs$$

where gm is the transconductance for Q2 620, L2 is the inductance of the inductor 640 and Cgs is the gate-source capacitance for Q2 620. Thus, Q2 620 and inductor 640 characterize the input impedance and may be readily designed to present a desired impedance. For example, if an input resistance of 50Ω is desired (to match a corresponding impedance of the CPW network), the channel dimensions for Q2 and dimensions for inductor 640 may be designed accordingly. The gain of matching amplifier 600 is proportional to the inductance of L1.

Figure 6:
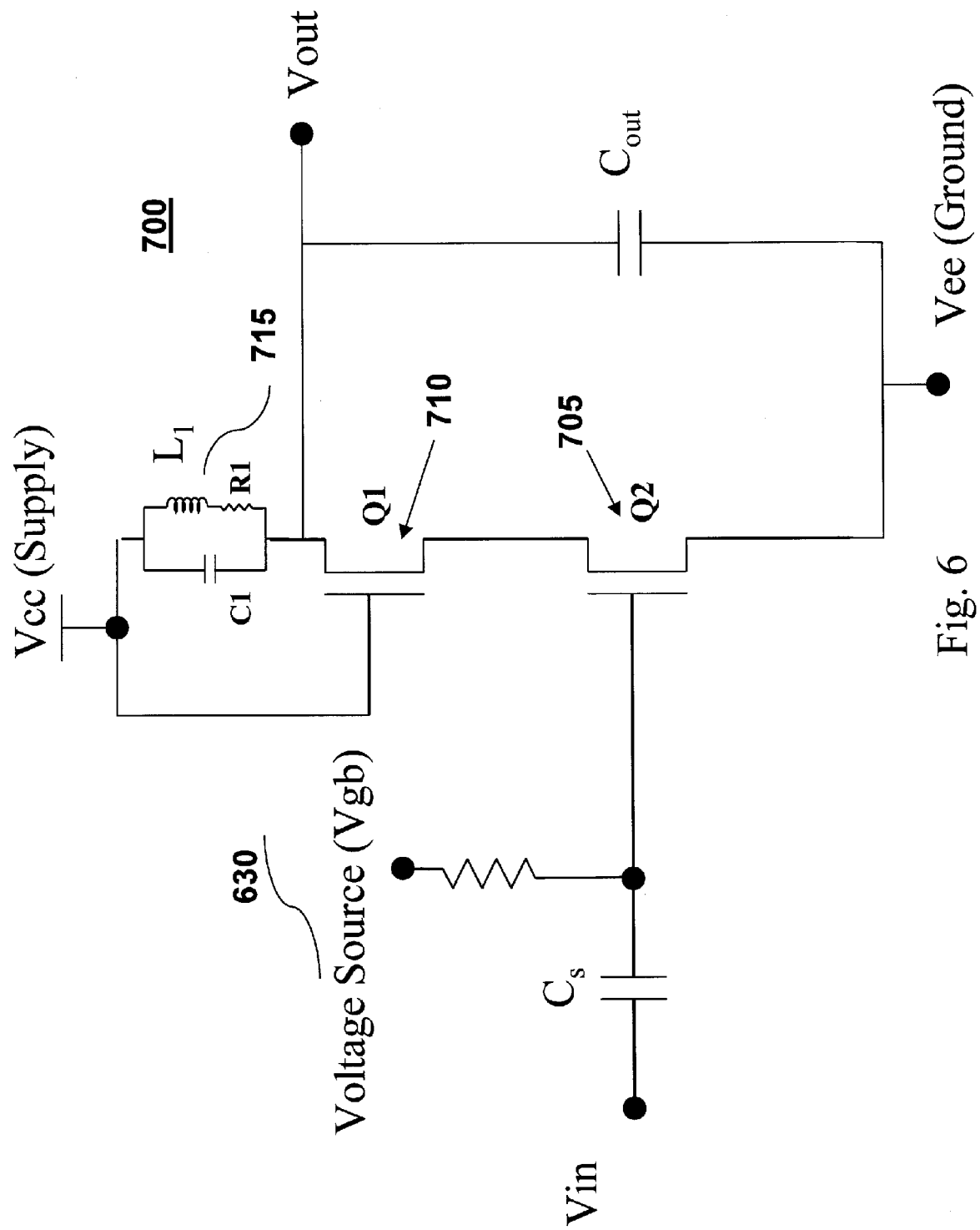
FIG. 6 is a schematic illustration of a driving amplifier for distributed amplification in accordance with an embodiment of the invention.

An exemplary driving amplifier 700 is illustrated in FIG. 6. Driving amplifier 700 is constructed analogously to matching amplifier 600 except that no inductor loads the source of Q2 705 (alternatively, an inductor having a fraction to 1/10 the inductance of L1 may load the source of Q2). The gain of driving amplifier 700 is proportional to the inductance of L1. A transistor Q1 710 has its drain loaded with integrated inductor L1 715 in a similar fashion as discussed with regard to Q1 605 of matching amplifier 600. Inductor 715 determines a center frequency Fd for driving amplifier 700 whereas both inductors 640 and 610 establish a resonant frequency Fm for matching amplifier 600. It may be shown that the band-pass center frequency Fc of a series-connected driving and matching amplifier is given as $$Fc=1/2*sqrt\ (Fd^2+Fm^2)$$

Referring back to FIG. 3a, a series of driving amplifier/matching amplifier pairs 430 are shown coupling feed point 405 to a first network intersection 460. In such an "H" configured network array, network 410 will continue to branch from intersection 460 such as at an intersection 470. For a half-duplex embodiment, driving amplifier/matching amplifier pairs 430 may also be incorporated in receiving network 510 as seen in FIGS. 3b and 4. For illustration clarity, the distribution of the driving amplifier/matching amplifier pairs 430 is shown only in selected transmission paths in FIGS. 3a and 3b. It will be appreciated that both the driving amplifiers and the matching amplifiers may be constructed using alternative arrangements of bipolar transistors such as PNP bipolar transistors or NPN bipolar transistors. In a bipolar embodiment, biasing voltage sources 630 are replaced by biasing current sources. In addition, the RF feed network and these amplifiers may be constructed in either a single ended or differential fashion. DC and control lines may be arranged orthogonally to the RF distribution direction for isolation. In addition, this same orthogonality may be maintained for the RF transmit and receive networks in a full duplex design.

Figure 7:
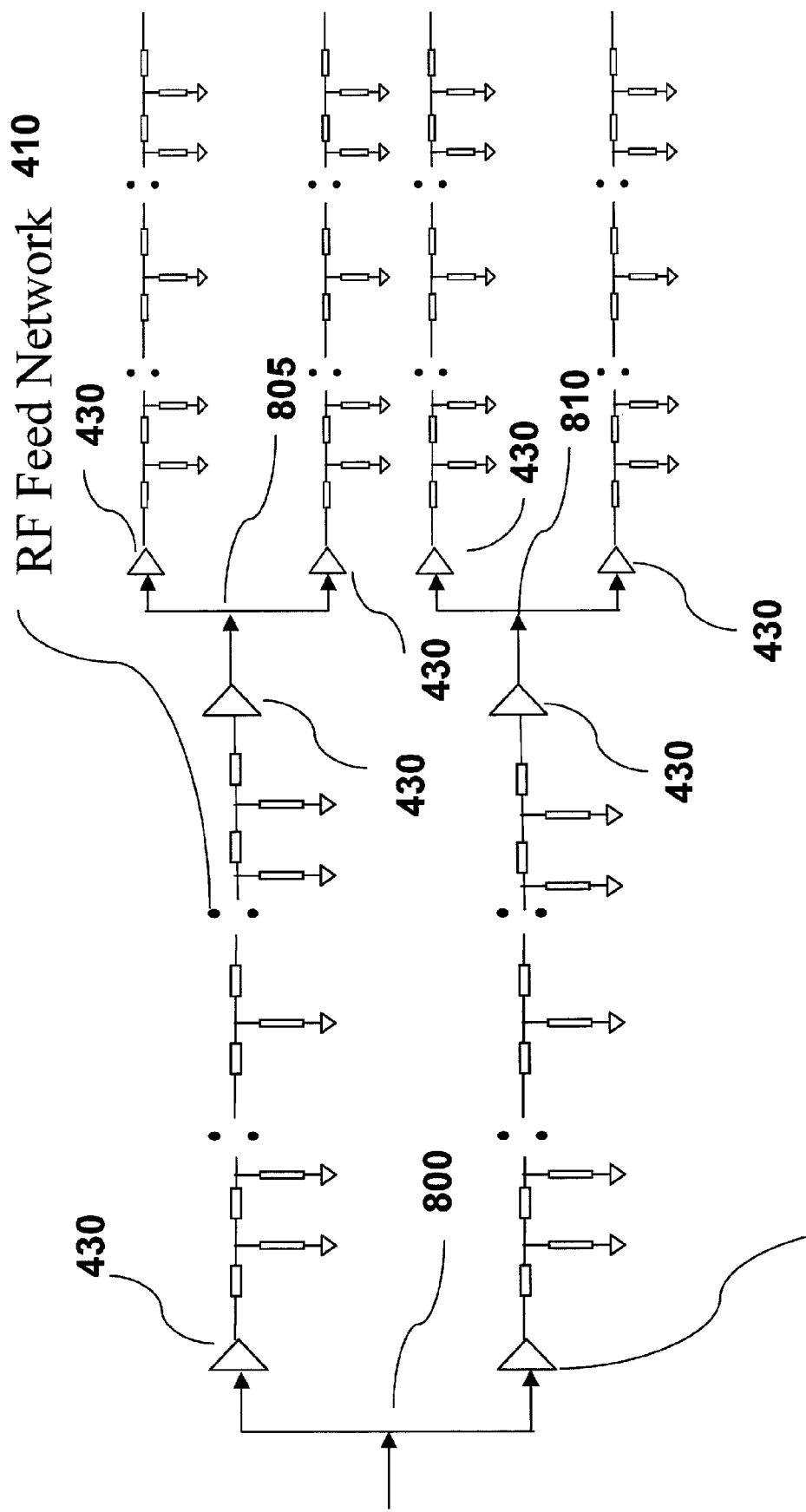
FIG. 7 illustrates a distributed amplification arrangement with respect to a splitting junction in accordance with an embodiment of the invention.

Turning now to FIG. 7, a single driving amplifier/matching amplifier pair 430 may both precede and follow network branching intersections 800, 805, and 810 in transmission network 410. Alternatively, just a single pair 430 may drive each branching intersection. It will be appreciated that the same considerations apply to a receiving (and hence combining) network.

Figure 8:
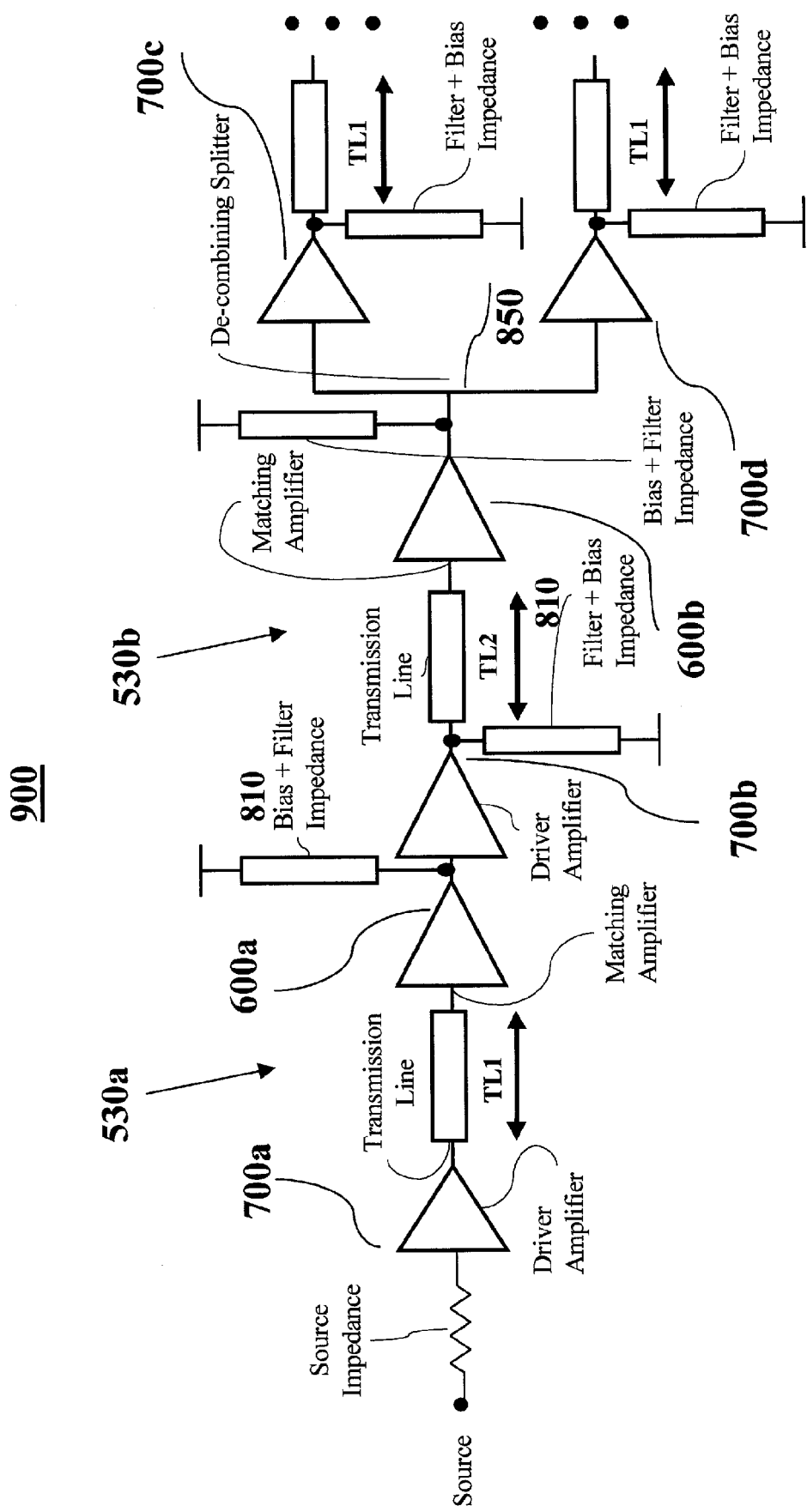
FIG. 8 illustrates a distributed amplification arrangement with respect to a splitting junction in accordance with an embodiment of the invention.

The resonant network properties are influenced by the distance between driving amplifiers and matching amplifiers in successive driving amplifier/matching amplifier pairs. For example, as seen for RF network portion 900 in FIG. 8, its input or source is received at a first driver amplifier 700a, which drives a matching amplifier 600a separated from driver 700a by a length of network transmission line (such as coplanar waveguide) of length TL1. Driver amplifier 700a and matching amplifier 600a thus constitute a first driving amplifier/matching amplifier pair 530a, which may also be denoted as a load balanced amplifier (LBA). Matching amplifier 600a is immediately followed by a driver amplifier 700b, which couples to the output of matching amplifier 600a directly in the active circuitry silicon rather than through a transmission line section. In this fashion, die space on the wafer substrate is conserved. However, it will be appreciated that an RF network CPW transmission line segment could also be used to couple matching amplifier 600a to driving amplifier 700b. Driver amplifier 700b drives a matching amplifier 600b separated from driver 700b by a length TL2 of network transmission line. Driver amplifier 700b and matching amplifier 600b thus form a second driving amplifier/matching amplifier 530b. The necessary biasing and inductance loading as described with respect to FIGS. 5 and 6 are represented by bias and filter impedances 910. In general, the sum of TL1 and TL2 should equal one half of the center frequency wavelength. By changing the ratio of TL1/TL2 and the output capacitance, a maximum stable gain of approximately 20 to 30 dB may be obtained for 10 GHz to, for example, 40 GHz operation. In a linear amplification (as opposed to resonant operation) 10 GHz embodiment, stable gain and frequency performance may be realized for a capacitance load of 50 fF as TL1/TL2 is varied from 40% to 80%.

In prior art RF distribution networks splitting and combining signals was problematic and involved cumbersome combiner or splitter circuitry. However, note the simplicity involved for the coupling of matching amplifier 600b through a splitting junction 950 to driver amplifiers 700c and 700d. This coupling occurs through a node in the active circuitry substrate to conserve wafer substrate area. However, this substrate coupling may be replaced by a CPW transmission line segment in alternative embodiments. As compared to prior art splitters, not only is there no loss coupling through splitting junction 950, but there is a gain instead. Moreover, transmission through the RF feed network is low loss and low noise because the driver and matching amplifiers are tuned with reactive components only—no resistive tuning (and hence loss) need be implemented.

Figure 9:
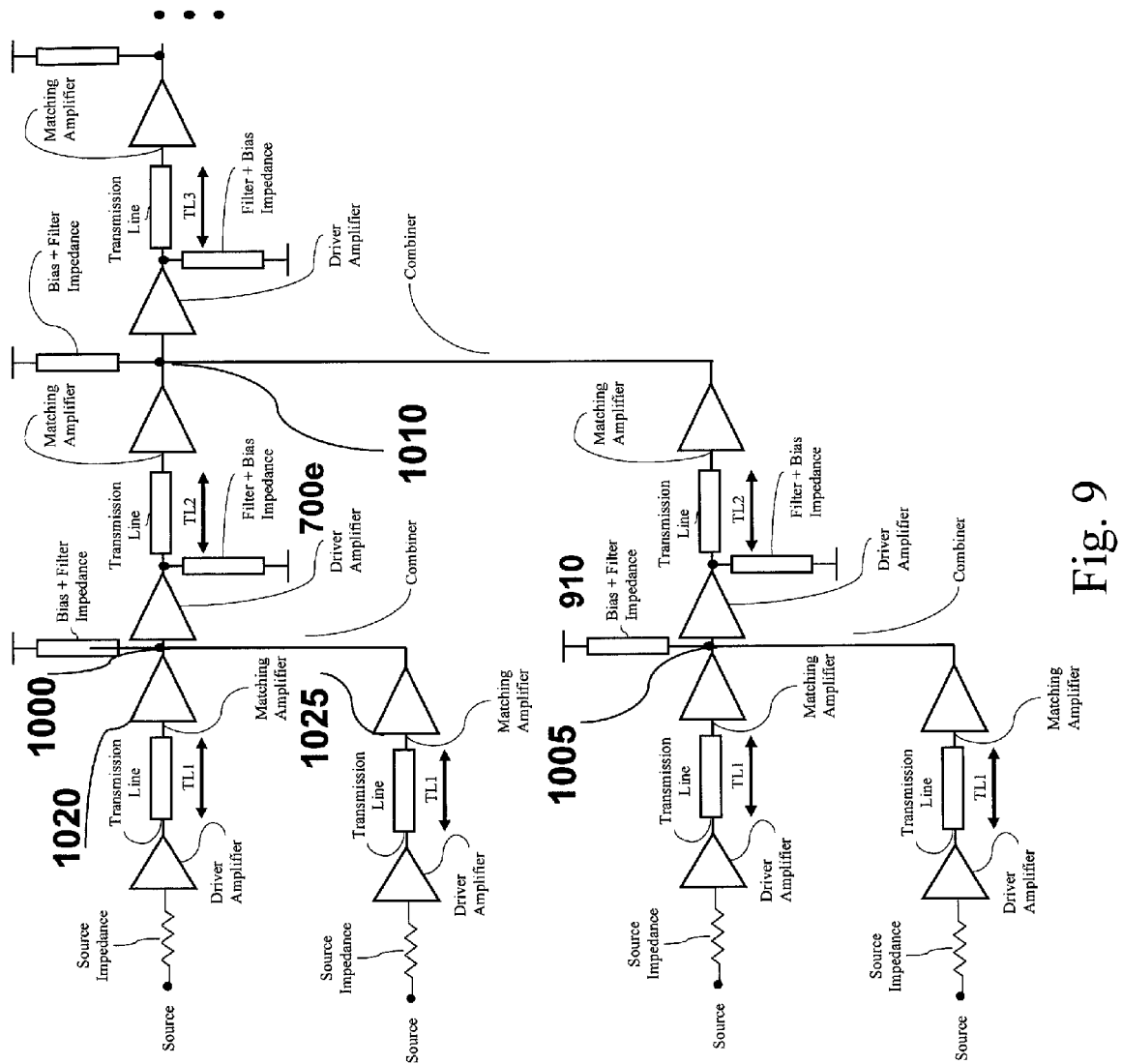
FIG. 9 illustrates a distributed amplification arrangement with respect to a combining junction in accordance with an embodiment of the invention.

The same low loss and simplicity of design advantages are present with respect to combining junction 1000, 1005, and 1010 for a receiving network as seen in FIG. 9. For example, with respect to junction 1000, two combiner matching amplifiers 1020 and 1025 (discussed further with regard to FIG. 10) couple through a node in the active circuitry substrate to a driving amplifier 700e to conserve wafer substrate area. However, it will be appreciated that a CPW transmission line segment may be used to perform this coupling in alternative embodiments. Bias and filter impedance 910 is thus shared by both combiner matching amplifiers.

Figure 10:
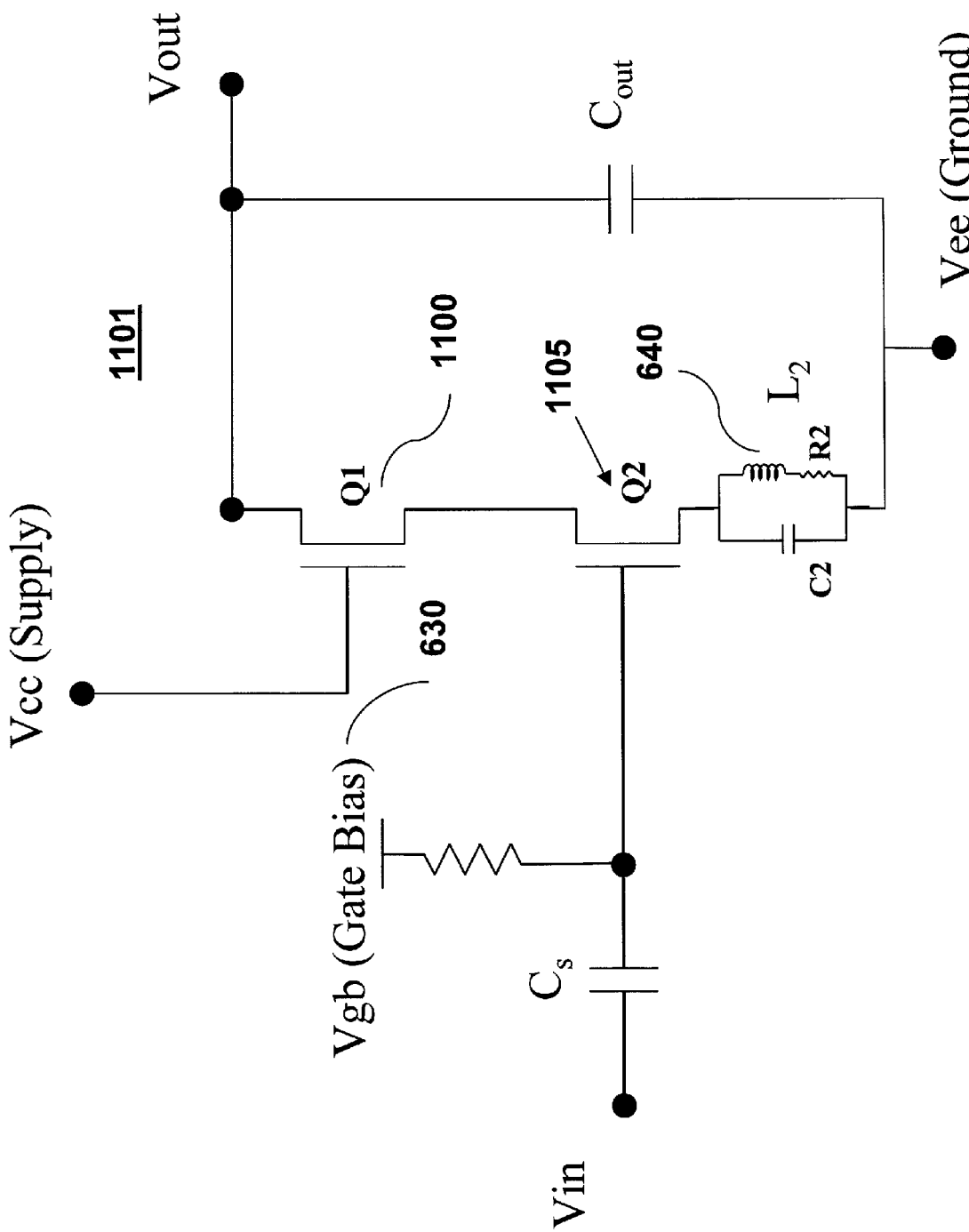
FIG. 10 is a schematic illustration of a matching amplifier for a combining junction used in distributed amplification in accordance with an embodiment of the invention.

Turning now to FIG. 10, a combiner matching amplifier 1101 is distinguished from a non-combiner matching amplifier such as discussed with respect to FIG. 5 by the absence of L1 at the drain of a FET Q1 1100. A FET Q2 1105 has its drain loaded by the matching inductor 640 for impedance matching as discussed with respect to FIG. 5. A common load inductor (not illustrated) couples to output node Vout to uniformly load all the involved combiner matching amplifiers.

The integration of the CPW network and the distributed amplification into a wafer scale integrated antenna module (WSAM) may be better understood by classifying the WSAM into three layers. The first layer would be a semiconductor substrate, such as silicon. On a first surface of the substrate, antennas such as patches for the integrated antenna circuits are formed as discussed, for example, in U.S. Pat. No. 6,870,503, the contents of which are incorporated by reference herein. Active circuitry for the corresponding integrated antenna circuits that drive these antennas are formed on a second opposing surface of the substrate. The CPW transmission network is formed adjacent this second opposing surface. The second layer would include the antennas on the first side of the substrate whereas the third layer would include the CPW network. Thus, such a WSAM includes the "back side" feature disclosed in U.S. Ser. No. 10/942,383, the contents of which are incorporated by reference, in that the active circuitry and the antennas are separated on either side of the substrate. In this fashion, electrical isolation between the active circuitry and the antenna elements is enhanced. Moreover, the ability to couple signals to and from the active circuitry is also enhanced. As discussed in U.S. Ser. No. 10/942,383, a heavily doped deep conductive junction through the substrate couples the active circuitry to vias/rods at the first substrate surface that in turn couple to the antenna elements. Formation of the junctions is similar to a deep diffusion junction process used for the manufacturing of double diffused CMOS (DMOS) or high voltage devices. It provides a region of low resistive signal path to minimize insertion loss to the antenna elements.

Upon formation of the junctions in the substrate, the active circuitry may be formed using standard semiconductor processes. The active circuitry may then be passivated by applying a low temperature deposited porous SiOx and a thin layer of nitridized oxide ($Si_xO_yN_z$) as a final layer of passivation. The thickness of these sealing layers may range from a fraction of a micron to a few microns. The opposing second surface may then be coated with a thermally conductive material and taped to a plastic adhesive holder to flip the substrate to expose the first surface. The substrate may then be back ground to reduce its thickness to a few hundreds of micrometers.

An electric shield may then be sputtered or alternatively coated using conductive paints on background surface. A shield layer over the electric field may form a reflective plane for directivity and also shields the antenna elements. In addition, parts of the shield form ohmic contacts to the junctions. For example, metallic lumps may be deposited on the junctions. These lumps ease penetration of the via/rods to form ohmic contacts with the active circuitry.

Figure 11:
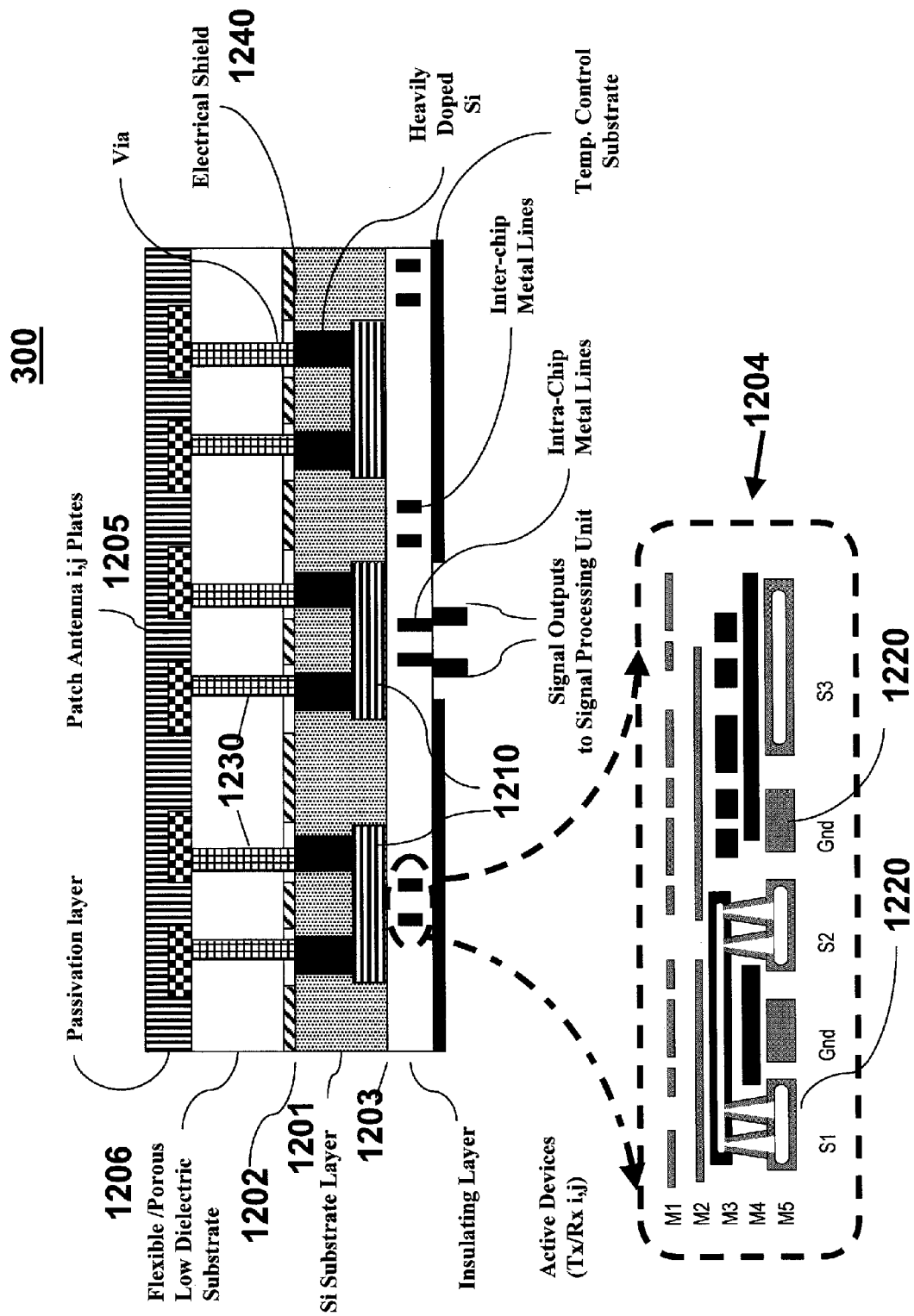
FIG. 11 is a cross-sectional view of an integrated antenna circuit having a coplanar waveguide RF feed network in accordance with an embodiment of the invention.

In an alternative embodiment, the CPW network may be integrated on the antenna side of the substrate. Because the backside approach has the isolation and coupling advantages described previously, the following discussion will assume without loss of generality that the RF feed network is integrated with the substrate in a backside embodiment. For example as seen in cross-section in FIG. 11, a semiconductor substrate 1201 has opposing surfaces 1202 and 1203. Antenna elements 1205 such as patches are formed on a dielectric layer 1206 adjacent to surface 1202. Active circuitry 1210 integrated with substrate 301 includes the driving and matching amplifiers for an RF feed network 1204 having CPW conductors S1 and S2. Adjacent surface 303, metal layer M1 includes inter-chip and other signal lines. Metal layer M2 forms, among other things, a ground plane for CPW conductors S1 and S2, which are formed in metal layer 5 as well as ground plates 1220. Metal layer M4 provides a connecting layer to couple CPW conductors together as necessary. The driving and matching amplifiers within active circuitry 1210 couple through vias (not illustrated) in apertures in the ground plane in metal layer M2 to CPW conductors S1 and S2. This active circuitry may also drive antennas 1205 through a plurality of vias 1230 that extend through the dielectric layer. An electric shield layer 1240 isolates the dielectric layer from surface 1202 of the substrate. The antennas may be protected from the elements and matched to free space through a passivation layer.

Just as active circuitry is distributed across the CPW network for amplification (using, e.g., the matching and driving amplifiers discussed previously), active circuitry may also be used to form distributed phase shifters as will be explained further herein. The location of the distributed phase shifters depends upon the granularity desired for the beam steering capability. For example, referring back to FIGS. 3a and 3b, each antenna element 170 could receive individual phase shifting through an adjacent and corresponding distributed phase shifter. To save costs and reduce power consumption, subsets of antenna elements 170 may share in the phase shifting provided by a corresponding distributed phase shifter. For example, consider a subset 450 or 550 having sixteen antenna elements 170. As seen in FIG. 3a, a distributed phase shifter located adjacent an intersection 460 of network 410 would provide equal phase shifting for each of the elements within a subset 450. Similar subsets would have their own distributed phase shifter. Similarly, as seen in FIG. 3b, a distributed phase shifter located adjacent an intersection 560 of network 510 would provide equal phase shifting for each of the elements within subset 550 with respected a received RF signal. Thus, it may be appreciated that the granularity of the beam steering capability is a design choice and depends upon desired manufacturing costs and associated complexity.

Figure 12:
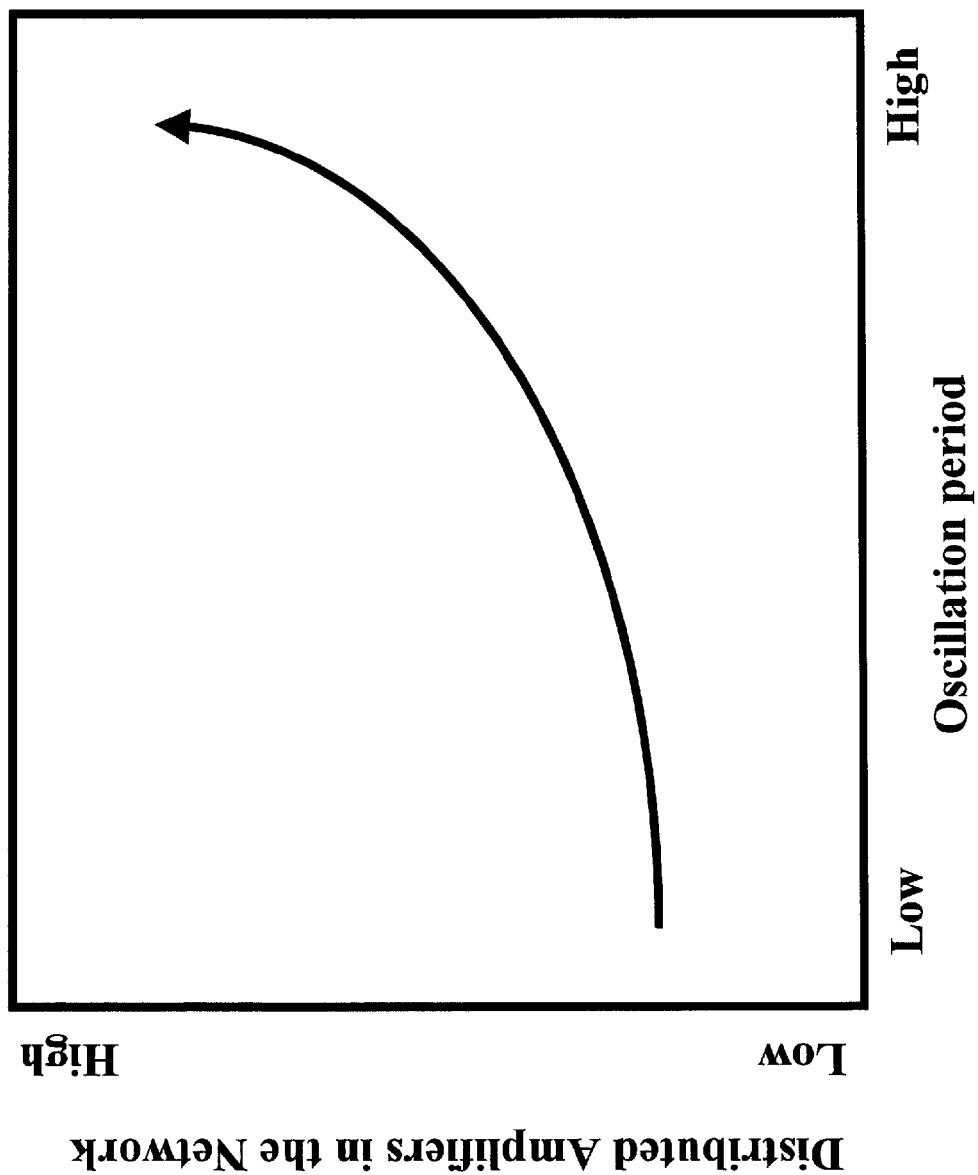
FIG. 12 is a graph of the resonant oscillation period for a resonant transmission network with distributed oscillation as a function of the number of distributed amplifiers.

It is believed that the resonant frequency of the resonant transmission network depends on the number of the distributed amplifiers (entire length of transmission line) from central triggering point 405 reaching to each individual integrated antenna circuit. For example, it is believed that resonant oscillation may be achieved for a 128 quarter wavelength transmission distance from point 405 to each integrated antenna circuit with TL1=400 micron and TL2=1250 micron, a Q1 current sink ability of 15× that of Q2 (in both driver and matching amplifier) with 2× source ability and a triggering pulse width of 20 pS and repetition rate of 3600 pS produces a steady state oscillation of 600 mV and frequency of 20 GHz at the termination point for appropriate values of the resonant loads. Advantageously, such 20 GHz distribution may need consume only 30 mV across the wafer. In contrast, an integrated oscillator circuit approach may require 1000 times more power. Changing the pulse triggering repetition to 400 pS and reducing the load to 3× and the sink to 3× with regard to the minimum geometry for the Q1 and Q2 transistors yields a 33 GHz oscillation frequency. Further reduction of transistor Q1 to 1× and Q2 to 1× results in a frequency of oscillation close to 45 GHz. In general, as the number of distributed amplifiers in increased in the resonant network, the resonant oscillation period will increase due to the parasitic loading from the increased number of active devices as shown in FIG. 12.

Figure 13:
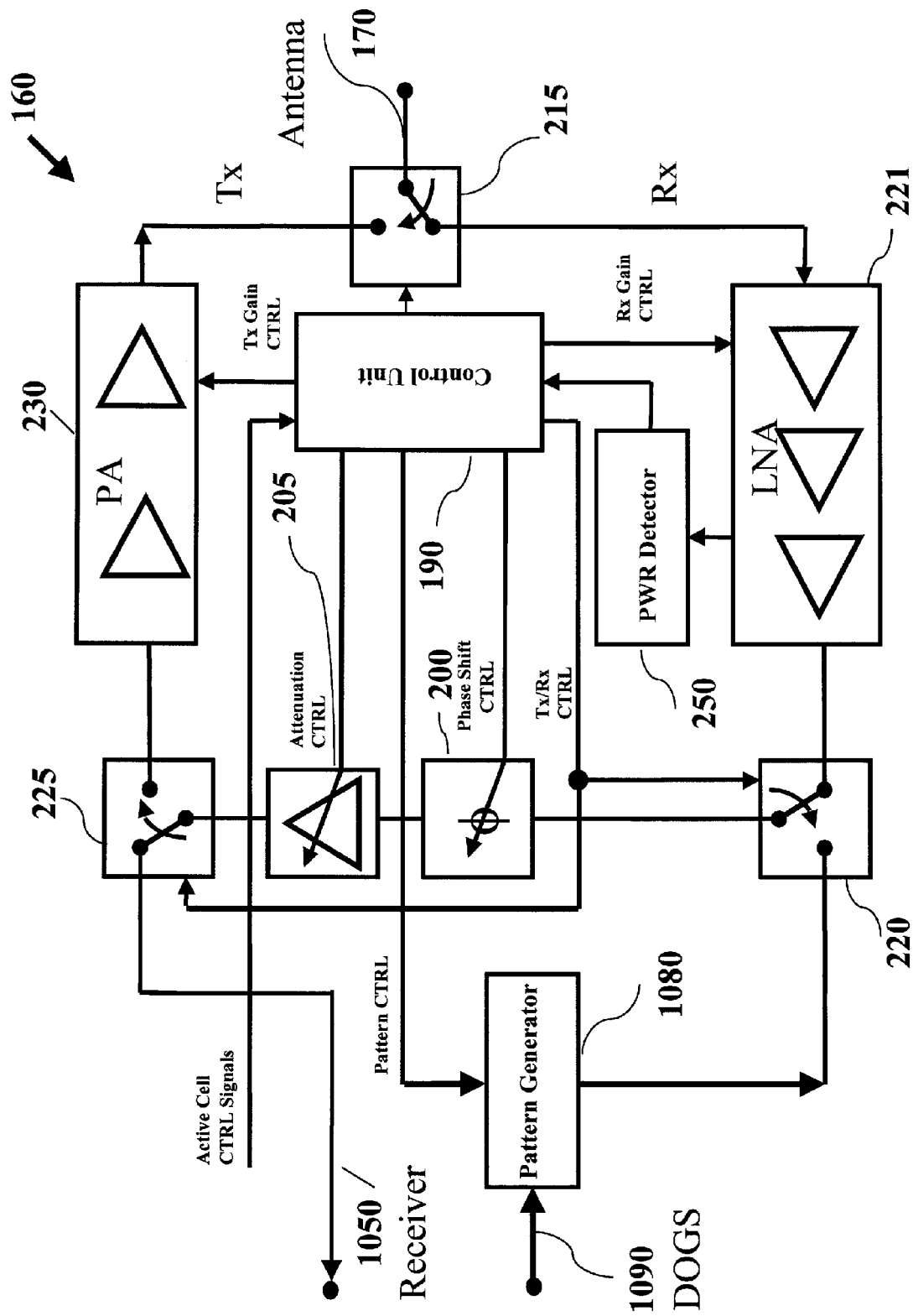
FIG. 13 is a schematic illustration of an RF beamforming interface circuit adapted to couple to the resonant transmission network of FIG. 3.

An exemplary RF beamforming interface circuit 160 configured to couple to the resonant transmission network (distributed oscillator) is illustrated in FIG. 13. Because of the global synchronization (GS) provided by the distributed oscillator (DO), the distributed oscillator may also be denoted as a distributed oscillator for global synchronization (DOGS) 1090. The RF signal from DOGS 1090 couples to a pattern generator 1080 such as the pulse shaper discussed earlier. Alternatively, any suitable modulation may be imposed on the RF signal in pattern generator 1080 as controlled by control unit 190. The remaining components in unit 160 function as discussed with regard to FIG. 2 to provide a received signal to a receiving network 1050.

Figure 14:
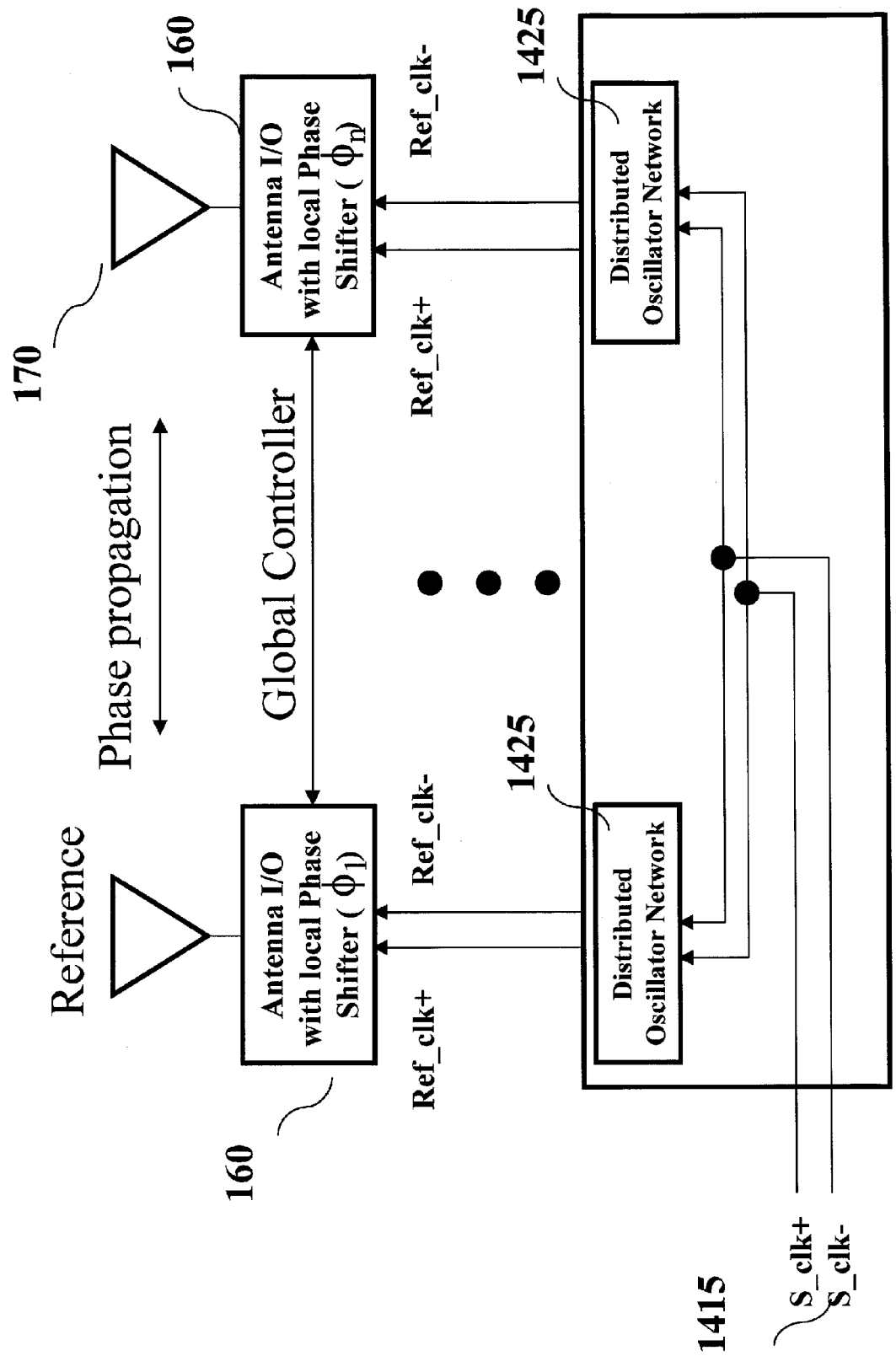
FIG. 14 is a conceptual illustration of a wafer scale antenna module having a differential distributed oscillator.

As discussed earlier, the transmission network may be constructed as either a single ended or a differential network. A differential DOGS 1425 is illustrated in FIG. 14. It can be shown that a differential DOGS 1425 provides a significant signal-to-noise advantage over a single ended design. DOGS 1425 is triggered by a differential triggering signal 1415 which results in a globally synchronized oscillation such that an RF signal is delivered to RF beamforming interface circuits 160.

It will be obvious to those skilled in the art that various changes and modifications may be made without departing from this invention in its broader aspects. The appended claims encompass all such changes and modifications as fall within the true spirit and scope of this invention.

I claim:

1. An integrated circuit antenna array, comprising:
   a substrate,
   a plurality of antennas adjacent the substrate; and
   an RF network adjacent the substrate, the RF feed network coupling to a distributed plurality of amplifiers integrated with the substrate, wherein the RF feed network and the distributed plurality of amplifiers are configured to form a resonant network such that if a timing signal is injected into an input port of the RF network, the resonant network oscillates to provide a globally synchronized RF signal to each of the antennas.

2. The integrated circuit antenna array of claim 1, wherein the substrate is a semiconductor wafer substrate.

3. The integrated circuit antenna array of claim 1, wherein the RF feed network is implemented using waveguides selected from the group consisting of microstrip waveguides, co-planar waveguides, and planar waveguides.

4. The integrated circuit antenna array of claim 3, wherein the antennas are adjacent a first surface of the substrate and wherein the RF feed network is a co-planar waveguide network adjacent an opposing surface of the substrate, the active circuitry being integrated into the opposing surface.

5. The integrated circuit antenna array of claim 3, wherein the co-planar waveguide network is formed in metal layers adjacent the opposing surface of the substrate.

6. An antenna array, comprising:
   a semiconductor substrate having a first surface and an opposing second surface;
   a plurality of heavily-doped contact regions extending from the first surface to the second surface;
   a plurality of antennas formed on an insulating layer adjacent the first surface, each antenna being coupled to corresponding ones of the contact regions by vias; and
   a conductor-based RF feed network adjacent the second surface for coupling an input port to the plurality of antennas, the RF feed network coupling to a distributed plurality of amplifiers integrated into the second surface of the substrate, wherein the RF feed network and the distributed plurality of amplifiers are configure to form a resonant network such that if a timing signal is injected into the input port of the RF feed network, a globally synchronized RF signal is received at each of the antennas.

7. The antenna array of claim 6, wherein the RF feed network is segmented into transmission line segment pairs, each transmission line segment pair having a first segment of length TL1 and a second segment of length TL2, the distributed amplifiers being organized into driving amplifiers and matching amplifiers, each segment corresponding to a driving amplifier and matching amplifier pair, wherein for each segment the corresponding driving amplifier drives RF signal through the segment to the corresponding matching amplifier.

8. The antenna array of claim 7, wherein the lengths TL1 and TL2 are chosen to maximize gain at a desired operating frequency.

9. The antenna array of claim 6, wherein the RF feed network comprises a coplanar waveguide network.

* * * * *